US 011536757B2

(12) United States Patent
Jennings et al.

(10) Patent No.: US 11,536,757 B2
(45) Date of Patent: Dec. 27, 2022

(54) CAPACITIVE SENSOR ASSEMBLIES AND ELECTRICAL CIRCUITS THEREFOR

(71) Applicant: Knowles Electronics, LLC, Itasca, IL (US)

(72) Inventors: Michael Jennings, McKinney, TX (US); Dean Badillo, Schaumburg, IL (US)

(73) Assignee: Knowles Electronics, LLC, Itasca, IL (US)

( * ) Notice: Subject to any disclaimer, the term of this patent is extended or adjusted under 35 U.S.C. 154(b) by 295 days.

(21) Appl. No.: 16/906,998

(22) Filed: Jun. 19, 2020

(65) Prior Publication Data
US 2021/0396795 A1    Dec. 23, 2021

(51) Int. Cl.
| | | |
|---|---|---|
| H03F 1/22 | (2006.01) |
| G01R 27/26 | (2006.01) |
| B81B 3/00 | (2006.01) |
| H03F 1/26 | (2006.01) |
| H03F 3/187 | (2006.01) |
| H03F 3/21 | (2006.01) |
| H03F 3/213 | (2006.01) |
| H04R 3/00 | (2006.01) |

(52) U.S. Cl.
CPC ........ *G01R 27/2605* (2013.01); *B81B 3/0021* (2013.01); *H03F 1/26* (2013.01); *H03F 3/187* (2013.01); *H03F 3/211* (2013.01); *H03F 3/213* (2013.01); *H04R 3/00* (2013.01); *B81B 2201/0257* (2013.01); *B81B 2201/0264* (2013.01); *H03F 2200/03* (2013.01); *H03F 2200/219* (2013.01); *H03F 2200/372* (2013.01)

(58) Field of Classification Search
CPC .............................. H03F 1/22; H03F 3/2176
USPC .................................................. 330/310, 311
See application file for complete search history.

(56) References Cited

U.S. PATENT DOCUMENTS

| | | | |
|---|---|---|---|
| 5,861,779 A | * | 1/1999 | Loeppert ................. H03F 3/505 |
| | | | 330/296 |
| 7,092,538 B2 | | 8/2006 | Potter |
| 7,221,766 B2 | | 5/2007 | Boor |
| 7,688,987 B2 | | 3/2010 | Boor |
| 8,085,956 B2 | | 12/2011 | Jennings |
| 8,229,140 B2 | | 7/2012 | Jennings |
| 8,604,880 B2 | | 12/2013 | Boor |
| 8,890,615 B2 | | 11/2014 | Boor |

(Continued)

FOREIGN PATENT DOCUMENTS

| | | |
|---|---|---|
| CN | 1759633 B | 12/2010 |
| CN | 101919271 | 12/2010 |

(Continued)

*Primary Examiner* — Henry Choe
(74) *Attorney, Agent, or Firm* — Loppnow & Chapa; Matthew C. Loppnow

(57) ABSTRACT

A sensor assembly including a capacitive sensor, like a microelectromechanical (MEMS) microphone, and an electrical circuit therefor are disclosed. The electrical circuit includes a first transistor having an input gate connectable to the capacitive sensor, a second transistor having an input gate coupled to an output of the first transistor, a feedforward circuit interconnecting a back-gate of the second transistor and the output of the first transistor, and a filter circuit interconnecting the output of the first transistor and the input gate of the second transistor.

20 Claims, 4 Drawing Sheets

(56) References Cited

U.S. PATENT DOCUMENTS

| | | |
|---|---|---|
| 9,402,131 B2 | 7/2016 | Jennings |
| 9,590,571 B2 * | 3/2017 | Jennings ................. H03F 3/185 |
| 9,843,292 B2 | 12/2017 | Jennings |
| 10,616,691 B2 | 4/2020 | Badillo |
| 2004/0179702 A1 | 9/2004 | Boor |
| 2004/0179703 A1 | 9/2004 | Boor |
| 2007/0217628 A1 | 9/2007 | Boor |
| 2013/0058506 A1 | 3/2013 | Boor |
| 2014/0097906 A1 | 4/2014 | Jennings |
| 2015/0117675 A1 | 4/2015 | Jennings |
| 2017/0077911 A1 | 3/2017 | Badillo |

FOREIGN PATENT DOCUMENTS

| | | |
|---|---|---|
| CN | 103975607 | 8/2014 |
| CN | 104782048 | 7/2017 |

\* cited by examiner

CAPACITIVE SENSOR ASSEMBLIES AND ELECTRICAL CIRCUITS THEREFOR

TECHNICAL FIELD

The disclosure relates generally to capacitive sensor assemblies, for example, MEMS microphones, and electrical circuits for such sensor assemblies.

BACKGROUND

Hearing devices, such as hearing aids, true wireless stereo (TWS) earphones and other hearables worn on or in a user's ear typically employ one or more microphones and one or more sound-producing acoustic transducers that convert a microphone signal into an acoustic output signal. These and other applications require microphones having low power consumption, low noise and low distortion, among other characteristics. The once predominate use of electret microphones in these and other applications is being supplanted by capacitive microelectromechanical systems (MEMS) microphones for their low cost, small size and high sensitivity.

Capacitive microphones generally comprise a capacitive transduction element or motor (also referred to herein as a "capacitive sensor") like a MEMS die coupled to an electrical circuit that conditions a sensor signal before output to a host, like a hearing device. The electrical circuit typically includes a buffer-amplifier for impedance matching and a filter for frequency band shaping, among other components depending on the particular use case. FIG. 2 illustrates a prior art two-stage microphone buffer circuit comprising a first CMOS transistor having an input coupled to a capacitive motor $C_{MOTOR}$ and an output $V_{OUT1}$ coupled to the input of a second CMOS transistor by a band-shaping filter circuit. The buffer circuit is a predominant source of power consumption and noise and the signal-to-noise ratio (SNR) is limited by the current level and inter stage filter components. Reducing the resistance of the filter can lead to loading issues, e.g., slew rate or gain degradation.

The objects, features and advantages of the present disclosure will become more fully apparent to those of ordinary skill in the art upon careful consideration of the following Detailed Description and the appended claims in conjunction with the accompanying drawings described below.

DETAILED DESCRIPTION

The present disclosure relates generally to electrical circuits for sensor assemblies comprising a capacitive sensor. Such assemblies include microphones, vibration sensors and pressure sensors among other sensor assemblies. The capacitive sensor can be a microelectromechanical systems (MEMS) die, an electret or as some other capacitive transduction element. MEMS capacitive sensors typically have a capacitance between approximately 0.1 pF and 5.0 pF, but this range is only approximate and other capacitance sensors can have more or less capacitance.

Figure 1:
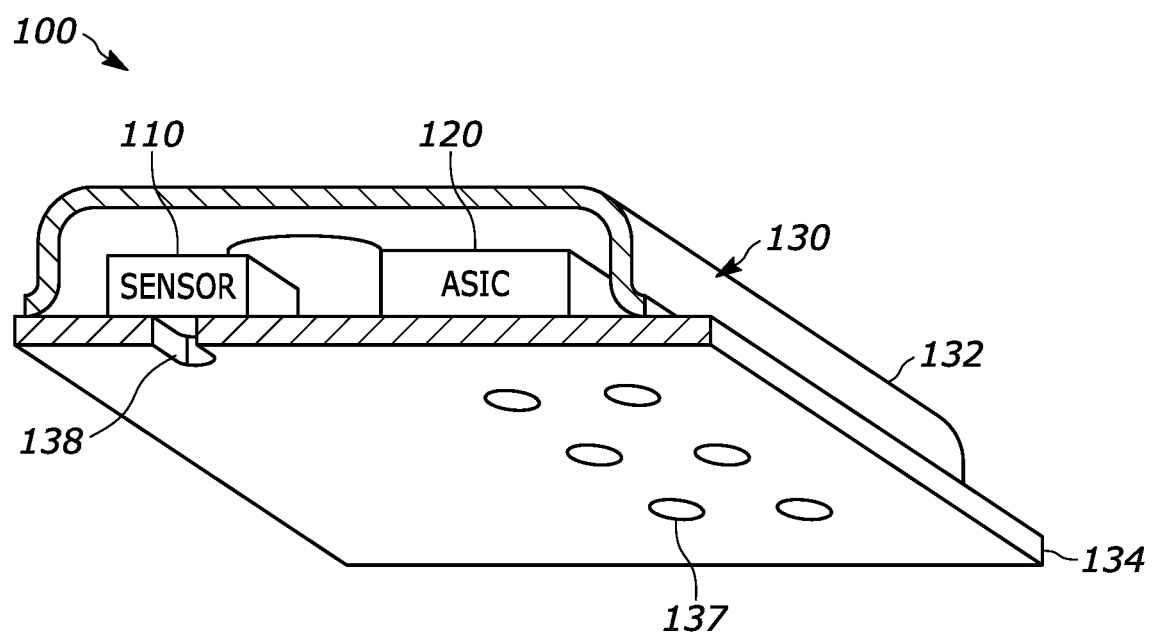
FIG. 1 is a sectional view of a generic capacitive sensor assembly.
Figure 2:
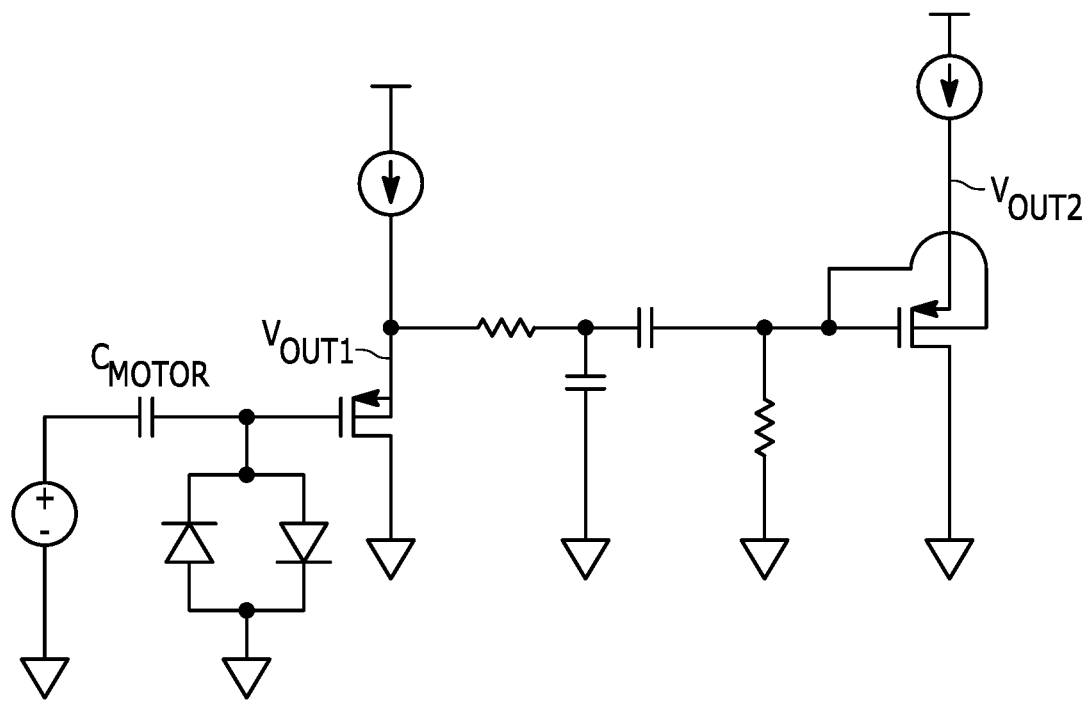
FIG. 2 is a prior art electrical circuit diagram including a two-stage buffer-amplifier in combination with a capacitive sensor.

FIG. 1 is a generic sensor assembly 100 comprising a capacitive sensor 110 electrically coupled to an electrical circuit 120, both of which are disposed in a housing 130 including a lid 132 mounted on a base portion 134 having an external-device interface with contacts 137 electrically coupled to the electrical circuit. The external-device interface can be a surface-mount interface, as shown in FIG. 1, or some other known or future interface technology for integration with a host device. Microphones and other sensor assemblies include a sound port 138 located on the base or lid wherein the sound port is acoustically coupled to the capacitive sensor as is known generally. Vibration sensor assemblies among others however can be devoid of a sound port.

The electrical circuit generally comprises a two-stage buffer-amplifier having an input coupled to the capacitive sensor and other components. For example, the electrical circuit can also include a charge pump connectable to the capacitive sensor for applications where the sensor requires a DC bias. A bias is not required for some capacitive sensors, like electrets and thus some circuits do not include the charge pump. Depending on the intended application, the electrical circuit can also comprise a band-shaping filter, among other circuit elements not shown in the drawings. The electrical circuit in digital sensors can include a delta-sigma analog-to-digital (A/D) converter circuit coupled to the output of the buffer-amplifier, and the electrical circuit in microphone assemblies can include a protocol interface circuit that formats the output signal for a particular protocol like PCM, PDM, SoundWire, etc. The electrical circuit can be one or more integrated circuits like an application specific integrated circuit (ASIC). In a typical sensor assembly, the electrical circuit typically includes power, ground, output and possibly other contacts connectable to corresponding contacts on the external-device interface by wire bonds or other known or future interconnect technology.

Figure 3:
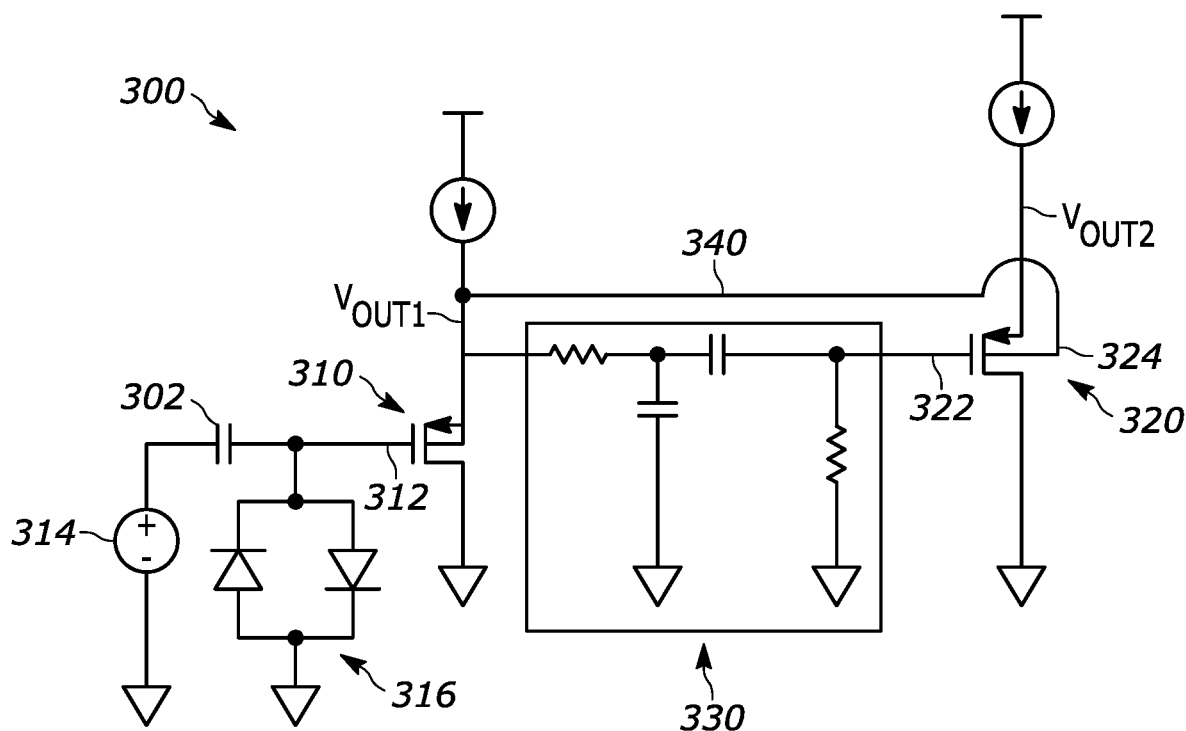
FIG. 3 is an electrical circuit diagram including a two-stage buffer-amplifier in combination with a capacitive sensor.
Figure 4:
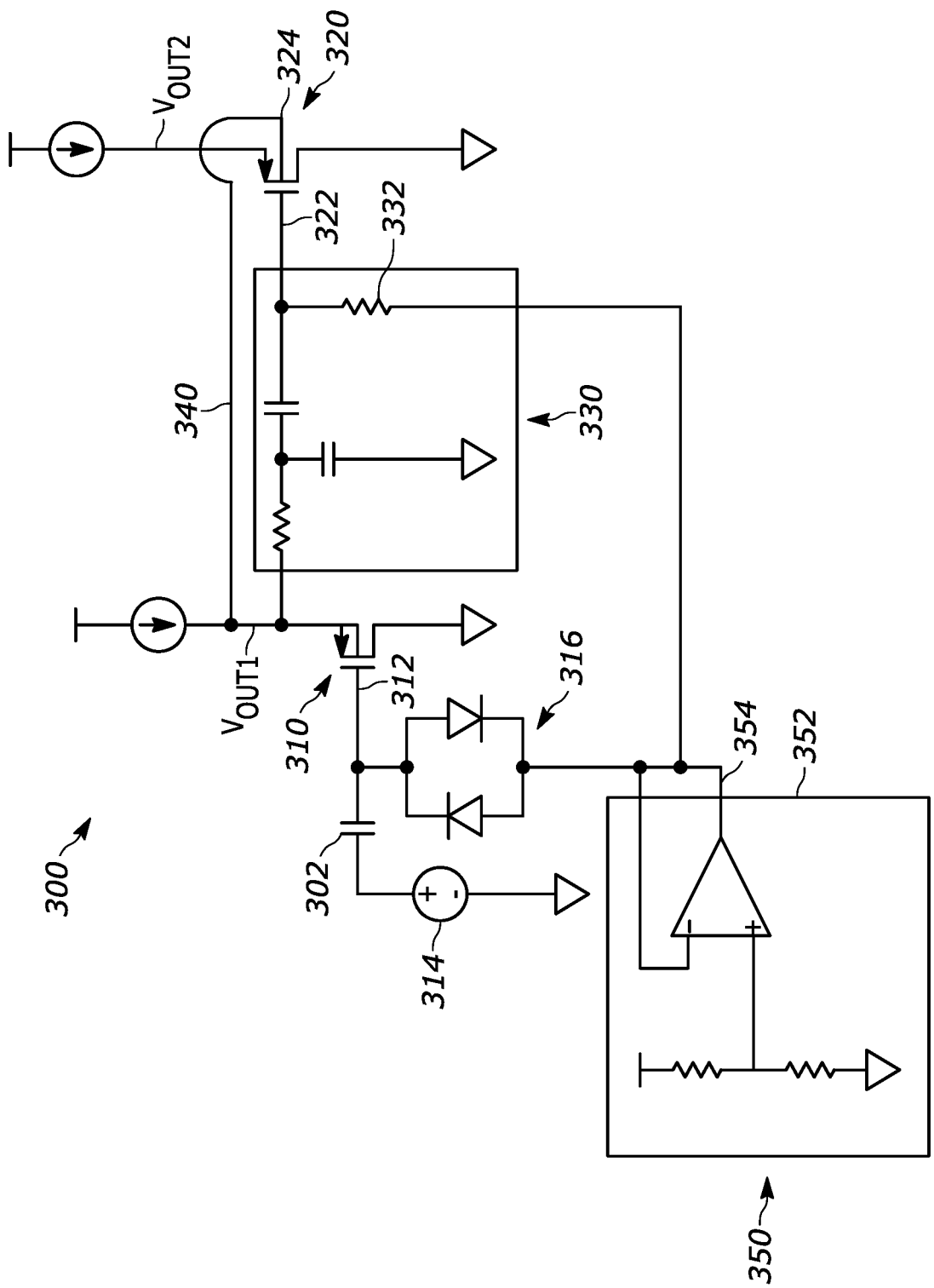
FIG. 4 is an alternative electrical circuit diagram including a two-stage buffer-amplifier in combination with a capacitive sensor.

FIGS. 3 and 4 show an electrical circuit 300 in combination with a capacitive sensor 302 wherein the circuit comprises a two-stage buffer-amplifier including a first transistor 310 and a second transistor 320. The first transistor includes an input gate 312 coupled to the capacitive sensor 302 and an output VOUT1 coupled to the second transistor as described further herein. The first and second transistors can be MOSFETS or JFETS among other transistors. In FIGS. 3 and 4, the first transistor is configured as a source-follower (also known as a common-drain topology) wherein the source is coupled to the output VOUT1. The second transistor is configured similarly. In other implementations, however one or both of the first and second transistors can be configured with different circuit topologies. Alternatively, the first transistor could be an op-amp and the second transistor can be an amplifier, like a Class AB source-follower, etc. Attenuation of the input signal can be reduced when the input capacitance of the buffer-amplifier is less than the capacitance of the capacitive sensor. In one implementation, the input capacitance of the buffer-amplifier is on the order of 0.1 pF, for example 0.2 pF.

According to another aspect of the disclosure, generally, the first transistor of the two-stage buffer-amplifier is coupled to the second transistor by a band-shaping filter circuit and a feedforward circuit. In microphone applications, the filter circuit is an audio band filter. In FIGS. 3 and 4, the band-shaping filter circuit is a bandpass filter 330 interconnecting the output $V_{OUT1}$ of the first transistor to the input 322 gate of the second transistor. Other filter circuits (e.g., low-pass, high-pass, notch filters) can be used alternatively, depending on the use case.

FIGS. 3 and 4 also show the second transistor including a back-gate 324 coupled to the output $V_{OUT1}$ of the first transistor by a feedforward circuit 340. In one implementation, the feedforward circuit is a direct electrical connection between the back-gate 324 of the second transistor and the output $V_{OUT1}$ of the first transistor. Alternatively, the feedforward circuit can include a filter circuit or a signal-processing element between the back-gate 324 of the second transistor and the output $V_{OUT1}$ of the first transistor.

Biasing the second stage output buffer to the first stage output reduces noise in the band-pass frequencies injected into the output since noise from the band-shaping filter circuit are not included in this control path. The band-shaping filter roll-off or slope depends on the ratio of transconductance of the metal/oxide/channel (gm) and transconductance of the bulk/channel (gmbs). The transconductance gm is generally much higher than the transconductance gmbs, thus the overall transfer function can have a roll-off or slope above and below the corner frequencies of the band-shaping filter.

The electrical circuit can optionally include other circuit elements at the input of the buffer-amplifier. In FIGS. 3 and 4, for example, a resistance element 316 comprising reversed diodes is coupled to the input gate 312 of the buffer-amplifier. Alternatively, the resistance element can be reversed transistors or a conventional resistor. The resistance element in combination with the capacitance of the capacitive sensor forms a high pass filter. A corner or cutoff frequency of the filter can be set by appropriate selection of the capacitance and resistance values of these circuit elements. For audio applications, the corner frequency can be set at the lower end of the human audible range of frequencies. In microphone implementations where the capacitance of the capacitive sensor is on the order of a pico-farad (pF), a resistance on the order of a gigohm will filter low frequency noise. The corner frequency for other types of sensors will depend on the use case. For example, ultrasonic sensors will have a higher corner frequency than audio sensors, while vibration sensors will have a lower cutoff frequency.

The electrical circuit can also include a sensor bias circuit, like a charge pump, in implementations where the capacitive sensor requires a bias voltage. In FIGS. 3 and 4, a charge pump 314 is coupled to one node of the capacitive sensor 302 and another node of the sensor is coupled to the input 312 of the buffer-amplifier. The charge pump is not required for capacitive sensors that do not require a bias.

According to another aspect of the disclosure, the electrical circuit further comprises a DC bias circuit coupled to the buffer-amplifier. Among other benefits, the DC bias circuit improves the dynamic range of the electrical circuit. In FIG. 4, a DC bias circuit 350 includes a comparator 352 with a bias signal output 354 coupled to the input gate 312 of the first transistor by the resistance element 316. The bias signal output 354 is also coupled to the input gate 322 of the second transistor by a resistor 332. In this embodiment, the resistor 332 is also part of the filter circuit 330.

Figure 5:
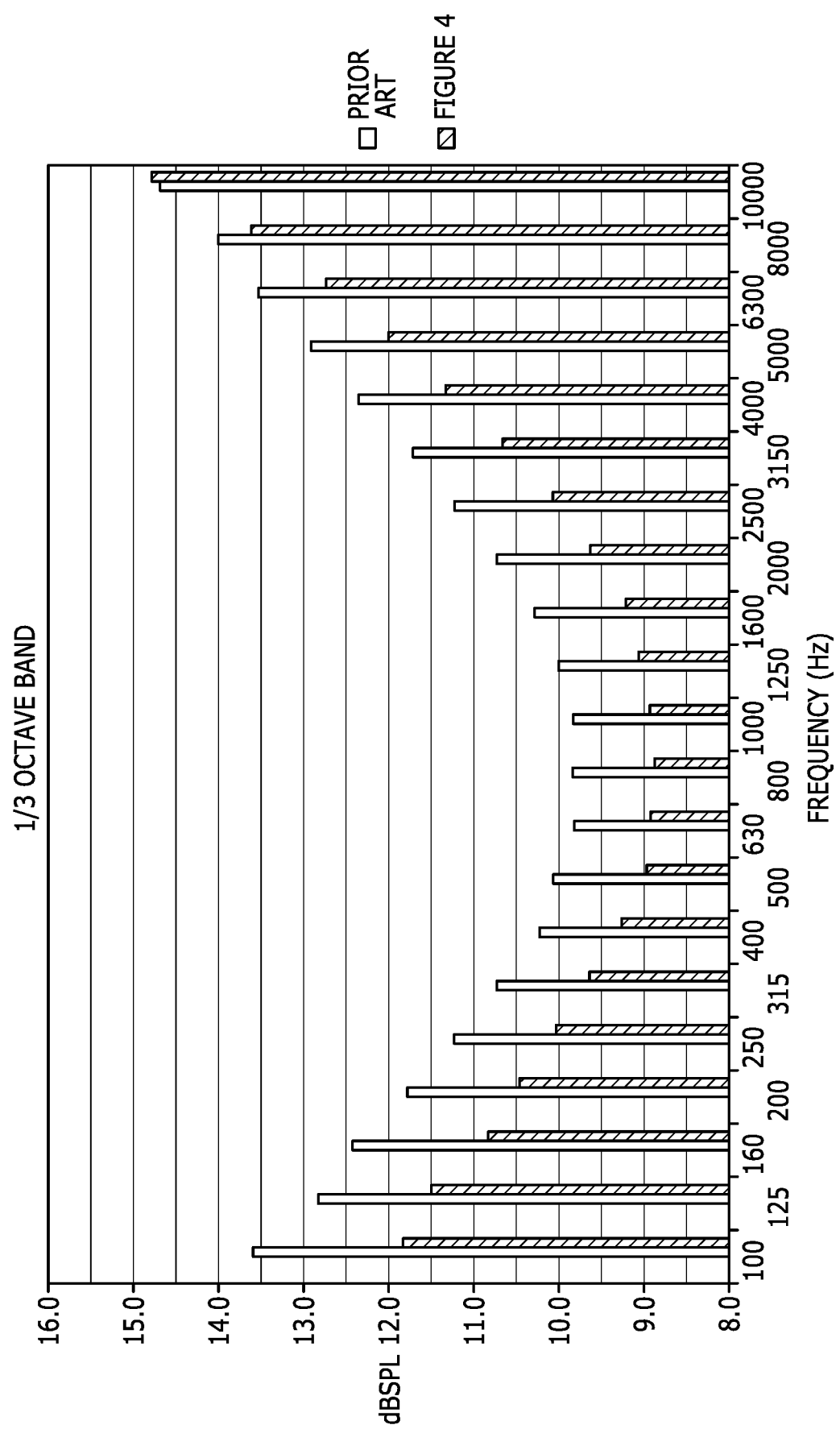
FIG. 5 is a qualitative illustration of improvement in noise performance for a microphone using the electrical circuit described herein compared to the prior art.

FIG. 5 illustrates the noise performance of a capacitive microphone implementing the circuit of FIG. 4 across the audio frequency band from about 100 Hz to 10 KHz. The noise is characterized as sound pressure level (SPL) with units of decibels (dB). The bar chart shows improved noise performance across the audio band, with relatively consistent improvement from about 100 Hz to about 5 KHz and somewhat decreasing improvement above 5 KHz. Noise improvement at higher frequencies is somewhat less due to high-frequency acoustic-dominant noise. The high frequency noise improvement will track the noise improvement at lower frequencies in microphones with non-acoustic (i.e., electronic) dominant high-frequency noise. The relative noise improvement across a majority of bands is 1-2 dB depending on acoustic noise to electronic noise contribution ratio.

According to one embodiment, the disclosure pertains to an electrical circuit for a capacitive sensor assembly, the circuit comprising a first transistor having an input gate connectable to a capacitive sensor, a second transistor having an input gate coupled to an output of the first transistor, a feedforward circuit interconnecting a back-gate of the second transistor and the output of the first transistor, and a filter circuit interconnecting the output of the first transistor and the input gate of the second transistor. The electrical circuit can be used in combination with a capacitive microelectromechanical systems (MEMS) die or other capacitive transduction element.

According to another embodiment, the disclosure pertains to integrated circuit for a capacitive microelectromechanical systems (MEMS) microphone assembly. The circuit comprises a first transistor configured as a source-follower comprising an input gate connectable to an output of a capacitive MEMS die, and a source coupled to an output of the first transistor, a second transistor configured as a source-follower comprising an input gate coupled to the output of the first transistor, a source coupled to an output of the second transistor, and a back-gate electrically coupled to the output of the first transistor, an audio band filter circuit interconnecting the output of the first transistor and the input gate of the second transistor, a DC bias circuit having a reference signal output coupled to the input gate of the first transistor by a resistance element, the reference signal output of the DC bias circuit coupled to the input gate of the second transistor by a resistance element. In one audio sensor (e.g., microphone) application, the transduction element has a capacitance between approximately 0.1 pF and approximately 5.0 pF and the input capacitance of the electrical circuit is on the order of 0.1 pF.

According to another embodiment, the disclosure pertains to a microphone sensor assembly comprising a capacitive microelectromechanical systems (MEMS) die and an integrated circuit disposed in a housing. The MES die is acoustically coupled to a sound port of the housing and the integrated circuit is electrically coupled to contacts on an external-device interface. The electrical circuit comprises a first transistor having an input gate coupled to a first node of the capacitive MEMS die, a second transistor having an input gate coupled to an output of the first transistor, the second transistor including a back-gate, a feedforward circuit interconnecting the back-gate of the second transistor and the output of the first transistor, a filter circuit interconnecting the output of the first transistor and the input gate of the second transistor, and a MEMS die bias circuit coupled to a second node of the capacitive MEMS die.

In one implementation of any of these embodiments, the feedforward circuit can be a direct electrical connection between the back-gate of the second transistor and the output of the first transistor. Alternatively, the feedforward circuit can include a filter circuit or a processing circuit between the back gate of the second transistor and the output of the first transistor.

In some implementations of any of these embodiments, the first transistor configured as a source-follower comprising a source coupled to the output of the first transistor and the second transistor configured as a source-follower comprising a source coupled to an output of the second transistor.

In some implementations of any of these embodiments, the electrical circuit includes a DC bias circuit having a reference signal output coupled to the input gate of the first transistor by a resistance element, and the reference signal output of the DC bias circuit is coupled to the input gate of the second transistor by a resistance element.

While the present disclosure and what is presently considered to be the best mode thereof has been described in a manner establishing possession by the inventors and enabling those of ordinary skill in the art to make and use the same, it will be understood and appreciated that equivalents of the exemplary embodiments disclosed herein exist, and that myriad modifications and variations may be made thereto, within the scope and spirit of the disclosure, which is to be limited not by the exemplary embodiments described but by the appended claims.

What is claimed is:

1. An electrical circuit for a capacitive sensor assembly, the circuit comprising:
   a first transistor having an input gate connectable to a capacitive sensor;
   a second transistor having an input gate coupled to an output of the first transistor, the second transistor including a back-gate;
   a feedforward circuit interconnecting the back-gate of the second transistor and the output of the first transistor; and
   a filter circuit interconnecting the output of the first transistor and the input gate of the second transistor,
   wherein the feedforward circuit bypasses the filter circuit.

2. The circuit of claim 1, wherein the feedforward circuit is a direct electrical connection between the back-gate of the second transistor and the output of the first transistor.

3. The circuit of claim 1, wherein the filter circuit is an audio bandpass filter.

4. The circuit of claim 1,
   the first transistor configured as a source-follower comprising a source coupled to the output of the first transistor,
   the second transistor configured as a source-follower comprising a source coupled to an output of the second transistor.

5. The circuit of claim 4 having an input capacitance on the order of 0.1 pF.

6. The circuit of claim 5 further comprising a sensor bias circuit connectable to the capacitive sensor, and a DC bias circuit having a reference signal output coupled to the input gate of the first transistor by a resistance element, the reference signal output also coupled to the input gate of the second transistor by a resistance element.

7. The circuit of claim 6, the first transistor including a back-gate coupled to the source of the first transistor.

8. The circuit of claim 6, wherein the filter circuit is an audio band filter.

9. The circuit of claim 8 is an integrated circuit die.

10. The circuit of claim 9 in combination with a capacitive microelectro-mechanical systems (MEMS) die having a capacitance between approximately 0.1 pF and approximately 5.0 pF.

11. An integrated circuit for a capacitive microelectromechanical systems (MEMS) microphone assembly, the circuit comprising:
    a first transistor configured as a source-follower comprising an input gate connectable to an output of a capacitive MEMS die, and a source coupled to an output of the first transistor;
    a second transistor configured as a source-follower comprising an input gate coupled to the output of the first transistor, a source coupled to an output of the second transistor, and a back-gate electrically coupled to the output of the first transistor;
    an audio band filter circuit interconnecting the output of the first transistor and the input gate of the second transistor;
    a DC bias circuit having a reference signal output coupled to the input gate of the first transistor by a resistance element, the reference signal output of the DC bias circuit coupled to the input gate of the second transistor by a resistance element,
    the circuit having an input capacitance on the order of 0.1 pF.

12. The circuit of claim 11, wherein the back-gate of the second transistor is directly connected to the output of the first transistor.

13. The circuit of claim 11 in combination with a capacitive microelectro-mechanical systems (MEMS) die having a capacitance between approximately 0.1 pF and approximately 5.0 pF.

14. A microphone sensor assembly comprising:
    a housing having an external-device interface and a sound port;
    a capacitive microelectromechanical systems (MEMS) die disposed in the housing and acoustically coupled to the sound port;
    an integrated circuit disposed in the housing and electrically coupled to contacts on the external-device interface, the circuit comprising:
    a first transistor having an input gate coupled to a first node of the capacitive MEMS die;
    a second transistor having an input gate coupled to an output of the first transistor, the second transistor including a back-gate;
    a feedforward circuit interconnecting the back-gate of the second transistor and the output of the first transistor;
    a filter circuit interconnecting the output of the first transistor and the input gate of the second transistor; and
    a MEMS die bias circuit coupled to a second node of the capacitive MEMS die.

15. The sensor of claim 14, wherein the feedforward circuit is a direct electrical connection between the back-gate of the second transistor and the output of the first transistor.

16. The sensor of claim 14,
    the first transistor configured as a source-follower comprising a source coupled to the output of the first transistor,
    the second transistor configured as a source-follower comprising a source coupled to an output of the second transistor.

17. The sensor of claim 16, the MEMS die having a capacitance between approximately 0.1 pF and approximately 5.0 pF and the buffer-amplifier having an input capacitance on the order of 0.1 pF.

18. The sensor of claim 17 further comprising a DC bias circuit having a reference signal output coupled to the input gate of the first transistor by a resistance element, the reference signal output of the DC bias circuit coupled to the input gate of the second transistor by a resistance element.

19. The sensor of claim 18 is a microphone and the filter circuit is an audio band filter.

20. The circuit of claim 19, the feedforward circuit is a direct electrical connection between the back-gate of the second transistor and the output of the first transistor.

* * * * *